United States Patent [19]
Costa

[11] Patent Number: 5,042,033
[45] Date of Patent: Aug. 20, 1991

[54] RAM-IMPLEMENTED CONVOLUTIONAL INTERLEAVER

[75] Inventor: Tony M. Costa, Kearny, N.J.

[73] Assignee: Canadian Marconi Corporation, Montreal, Canada

[21] Appl. No.: 361,415

[22] Filed: Jun. 5, 1989

[51] Int. Cl.$^5$ .............................................. G06F 11/10
[52] U.S. Cl. ........................................ 371/2.1; 371/43
[58] Field of Search .................... 371/2.1, 2.2, 43, 44, 371/45, 37.1

[56] References Cited

U.S. PATENT DOCUMENTS

| | | | |
|---|---|---|---|
| 3,652,998 | 3/1972 | Forney | 371/2.1 X |
| 4,394,642 | 7/1983 | Currie | 371/2.1 X |
| 4,547,887 | 10/1985 | Mui | 371/44 X |
| 4,710,923 | 12/1987 | Nagumo | 371/2.1 |
| 4,742,517 | 5/1988 | Takagi | 371/2.2 |

Primary Examiner—Jerry Smith
Assistant Examiner—Robert W. Beausoliel
Attorney, Agent, or Firm—Robin, Blecker, Daley & Driscoll

[57] ABSTRACT

A system for convolutional interleaving of data bits in accordance with preselected convolutional interleaving parameters employs random access memory (RAM) and control thereof is provided by WRITE and READ column and row signals, which are generated responsively to the interleaving parameters and permit realization of the system with memory requirements slightly more than shift register interleavers but substantially less than hetertofore known RAM interleaver implementations. In one system embodiment, the system output data bits involve both RAM output and the incoming data bit. In another system embodiment, pseudo random convolutional interleaving is attained, again responsively to the preselected convolutional interleaving parameters. In either system, the parameters may be changed as desired to accommodate performance need.

16 Claims, 8 Drawing Sheets

RAM-IMPLEMENTED CONVOLUTIONAL INTERLEAVER

FIELD OF THE INVENTION

This invention relates to digital data transmission and pertains more particularly to the transmission of digital data in manner lessening opportunity for interference therewith.

BACKGROUND OF THE INVENTION

It is common, in the transmission of digital data, to process the data bits to be transmitted to render the transmitted data bit stream less vulnerable to jamming. Typically, consecutive data bits provided for transmission are supplied to a convolutional interleaver and therein are spread apart in transmitted data bits by $J+1$ interleaved data bits, J being an integer below defined. However, a pulse jammer with a repetition period of $J+1$ data bits will cause the deinterleaver of a receiver to output sequentially jammed data bits as received data bits The foregoing problem can be overcome by operating the interleaver in pseudo random number (PN) mode. In this mode, every group of data bits to be interleaved is simultaneously pseudo randomly reordered, by different pseudo random sequences. The $J+1$ periodicity is accordingly eliminated from the interleaved data bit stream transmitted and the stream is consequently not vulnerable to pulse jamming.

One known type of I, J fixed convolutional interleaver comprises a system involving l delay paths, with the initial path producing no delay, i.e., having no delay cells, but with consecutive path each introducing nj delay cells, where n is the number of the paths in the succession and j is the individual cell delay value. The J term associated with the standard I, J fixed convolutional interleaver is given by the product of j*I.

Referring to FIG. 1, this type of fixed convolutional interleaver system FCIS has paths FCIS0, FCIS1, FCIS2, FCIS3, etc., through to path FCIS (I−1). Path FCIS0 has no delay. Path FCIS1 has a single delay cell FCIS1−1 of time length j. Path FCIS2 has two delay cells FCIS2−1a, −1b, each of time length j; providing a total delay of 2j. Path FCIS3 has three delay cells FCIS3−1a, −1b, −1c, each of time length j, providing a total delay of 3j. The structure continues progressively to end path FCIS (I−1), which has I−1 delay cells, with total delay of (I−1)j.

Hardware implementation is of course of paramount consequence to cost and speed of operation of interleavers and deinterleavers, the latter reversely replicating the former and being of like hardware composition.

In the FIG. 1 type system, shift register elements realize the delay cells. The total number of shift register elements required for this implementation amounts to one-half of the product of (I−1) and J. Another known type of convolutional interleaver employs random access memory to realize the data bit interleaving. This type of system involves considerably more storage element requirements, almost twice that of the shift register element implementation, i.e., the product of I and J.

Disadvantages of the first discussed type of interleaver are its invariance and the number of discrete components required for large I and J values. Thus, it is hardware implemented for handling preselected and unchangeable values for I and J.

A disadvantage of the second discussed type of interleaver is its memory requirement, as noted, almost twice that of the first type of system.

More importantly, both implementations are susceptible to periodic jammers.

SUMMARY OF THE INVENTION

The present invention has as its primary object the provision of improved system and practice for interleaving data bits by the use of random access memory and having less hardware requirements than presently known interleavers of this type.

A more particular object of the invention is the provision of interleavers realized by use of random access memory to provide protection against jamming by pseudo random interleaving.

Another object of the invention is the capability of configuring a particular (I,J) implementation to support any value of I and J less than the actual (I,J) without modifications to the implementation.

In attaining the foregoing and other objects, the present invention provides a system for receiving digital data signals for convolutional interleaving thereof in accordance with preselected convolutional interleaving parameters, namely I and J. The system includes a random access memory having a first input for receipt of the data signals, a second input for receiving row and column WRITE address signals for identifying storage locations in the memory for such received data signals, a third input for receiving row and column READ address signals for identifying storage locations from which data signals ar to be read out of said memory, and an output terminal for conveying such read out data signals from said memory.

The system output component for issuing such convolutionally interleaved data signals has first and second input terminals respectively for the receipt of the incoming signals to be interleaved and the receipt of the signals conveyed from the memory, an output terminal for furnishing the convolutionally interleaved data signals, and a third input terminal for receipt of a control signal for selectively connecting the first or said second input terminal with the output terminal.

A control unit receives input signals indicative of the convolutional interleaving parameters for selective generation of row and column WRITE and READ address signals for storage and read out of the data signals and for generation of the control signal.

In other aspects, the control unit includes a row counter responsive to one of the convolutional interleaving parameter (I) signals and a row count zero detecting means responsive to row count for generating the control signal. The row counter is resettable at count I and the control unit also includes a column counter incremented by the row count resetting. The control unit further includes a WRITE column generator responsive to the row count, the column count and a second one (j) of the convolutional interleaving parameter signals for generating the column WRITE address signals.

A second system embodiment is adapted for receiving digital data signals and for pseudo random convolutional interleaving thereof in accordance with preselected convolutional interleaving parameters. This embodiment includes the memory unit as above summarized, but does not employ the output selection of the first system, as above discussed. Further, the control unit of the second system has characteristics not present in the first system, namely, a pseudo random number generator, operative in the generation of row WRITE and READ address signals, and a modulo selector, performing a modulo function at the value of one of the convolutional interleaving parameter (I) signals and operative in the generation of column WRITE and READ address signals.

Apparatus configured in accordance with the invention is found to have element requirements which, though slightly more than the hardware requirements of the shift register prior art implementation, are substantially less than the memory requirements of known random memory access implementations of interleavers.

The foregoing and other objects and features of the invention will be further understood from the following detailed description of preferred embodiments and practices thereof and from the drawings, wherein like reference numerals identity like parts and components throughout.

DESCRIPTION OF PREFERRED EMBODIMENTS AND PRACTICES

Figure 2:
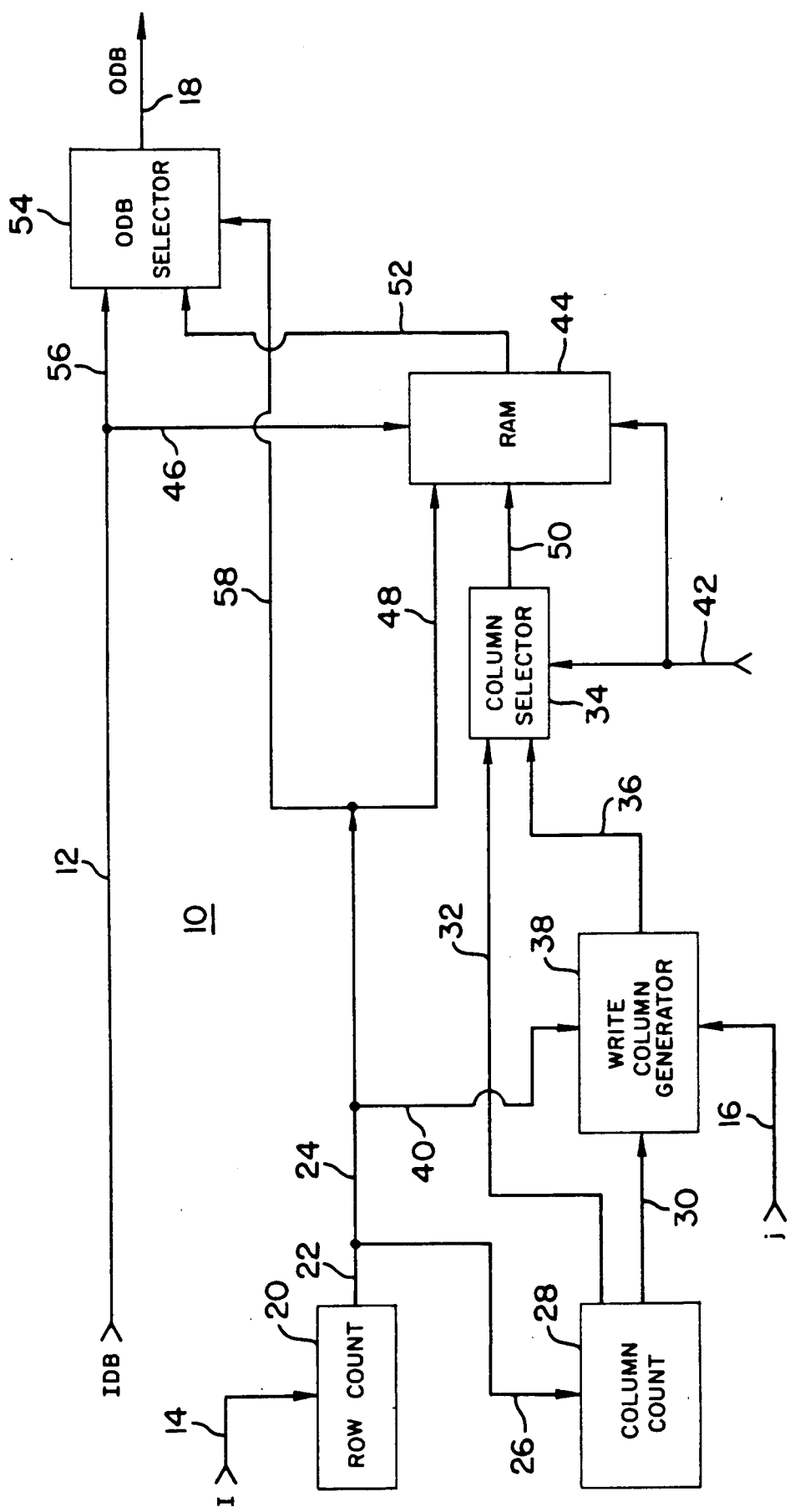
FIG. 2 is functional block diagram of a system in accordance with the invention.

Referring to FIG. 2, system 10 thereof according with the invention has three inputs, input data bits (IDB) for transmission applied to line 12, a selected value for I applied to line 14 and a selected value for j applied to line 16. The system output data bits (ODB) are provided on line 18.

Six functional circuits are provided, the first being row count circuit 20, which receives the line 14 I value input and furnishes row count output signals over line 22 to lines 24 and 26. A second functional circuit, column count circuit 28, receives the row count output signal from line 26 and furnishes column count output signals on lines 30 and 32. The line 30 signal is applied to column selector 34, a third functional circuit. The column count output signal on line 30 is applied to WRITE column generator 38, a fourth functional circuit, a further input to which is the j value signal on line 16 above noted. Generator 38 also receives the row count indication signal from line 24 over line 40.

Line 42 provides a signal, derived from an overall controller (not shown) governing the timing of operations, indicative selectively of READ or WRITE system condition, such signal being applied both to column selector 34 and RAM 44.

RAM 44, a fifth functional circuit, has further inputs derived from line 46, which is the IDB signal, from line 48, which is the row count signal, and from line 50, which is the column select signal.

Under the control of such inputs, RAM 44 provides output signals on line 52 to sixth functional circuit, ODB selector 54, which has two other input signals, one being the IDB on line 56 and the other being to count indication provided on line 58. Depending on the state of line 58, ODB selector will output on line 18 as the ODB one or the other of the inputs on lines 52 and 56.

Figure 3:
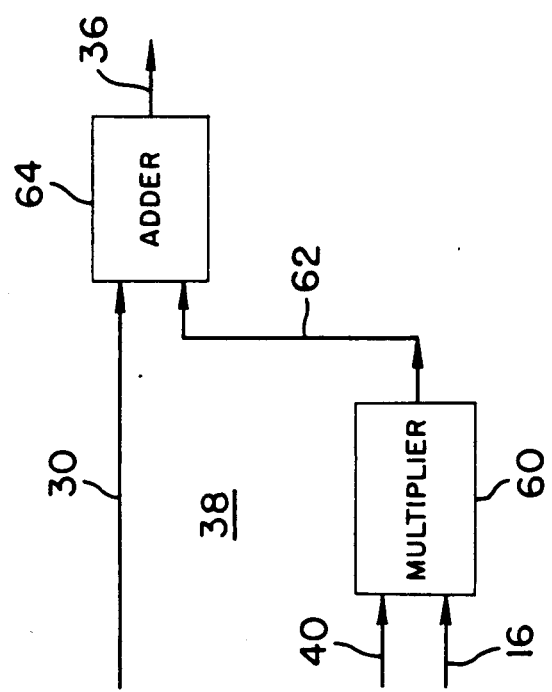
FIG. 3 is functional block diagram of the WRITE column generator 38 of the FIG. 1 system.

Turning to FIG. 3, WRITE column generator 38 of the FIG. 2 system includes multiplier 60, having inputs noted in FIG. 2 on lines 16 and 40, and providing its output on line 62. Adder 64 provides the output of generator 38 on line 36 by addition of the signal on line 62 and the line 30 signal indicative of column count.

Figure 4:
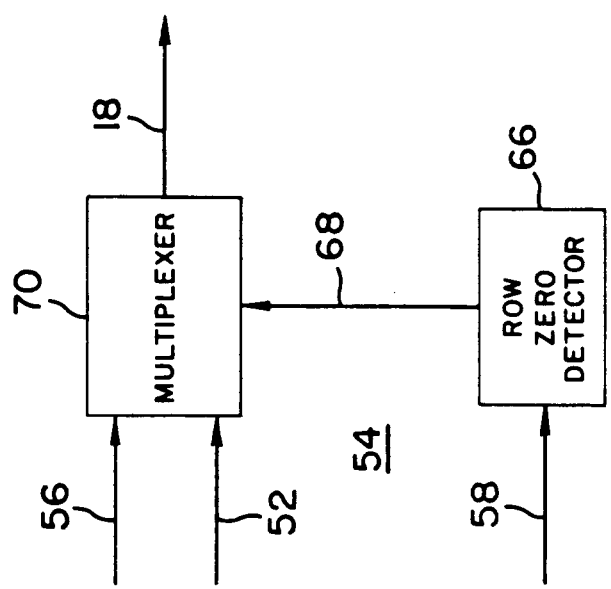
FIG. 4 is a functional block diagram of the output data bit (ODB) selector (ODB) 58 of the FIG. 1 system.

Referring to FIG. 4, ODB selector 54 includes row zero detector 66, which is responsive to the line 58 row count signal to set line 68 in one or the other state accordingly as the count signal indicates row zero or not. During line 68 states indicating row zero, multiplexer 70 furnishes to system output line the IDB on line 56. During line 68 states not indicating row zero, multiplexer 70 outputs the line 52 input, i.e., the then furnished RAM 44 output.

Figure 5A:
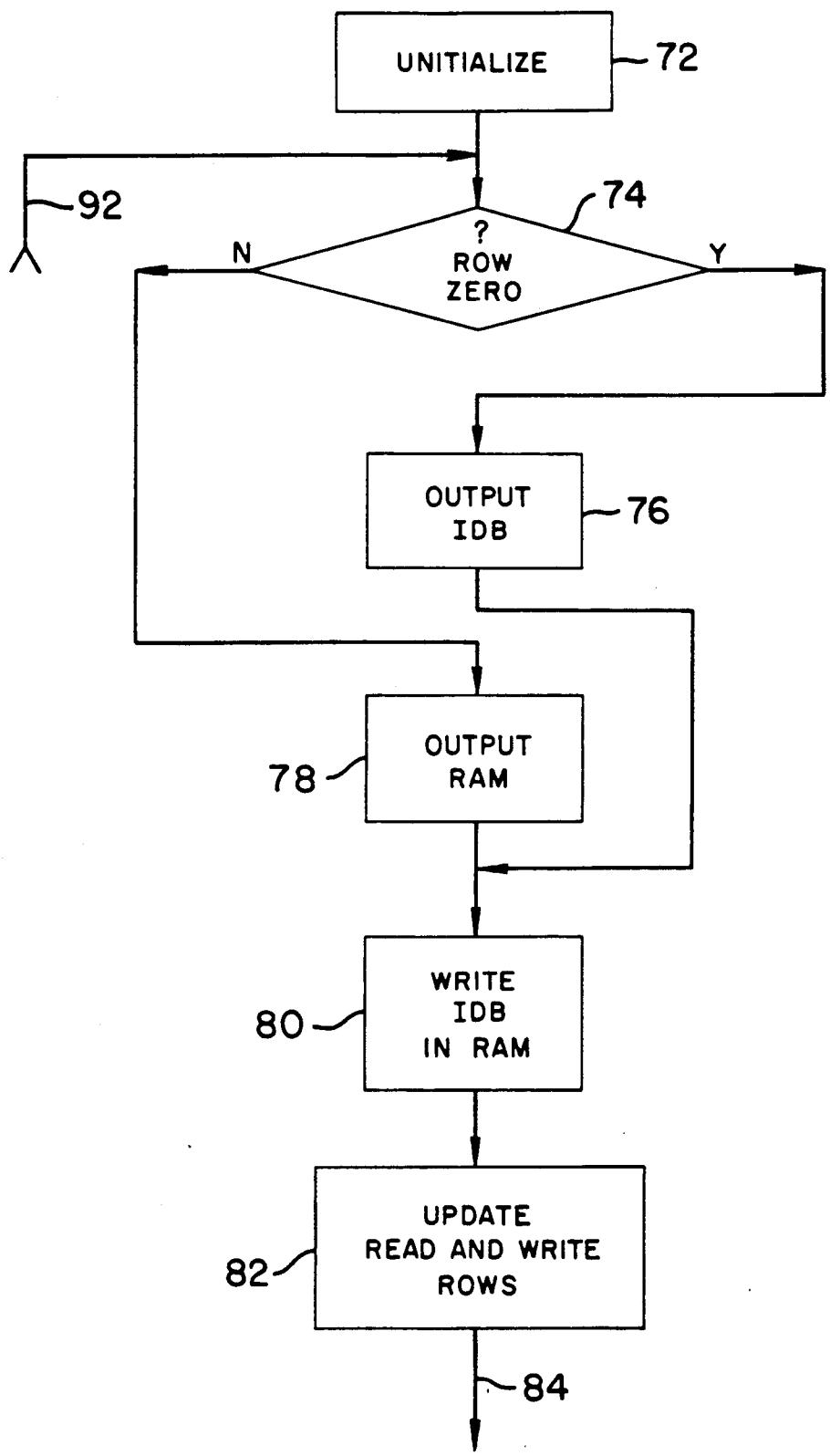
FIGS. 5A and 5B set forth flow charts of system activity for the FIG. 2 interleaver.
Figure 5B:
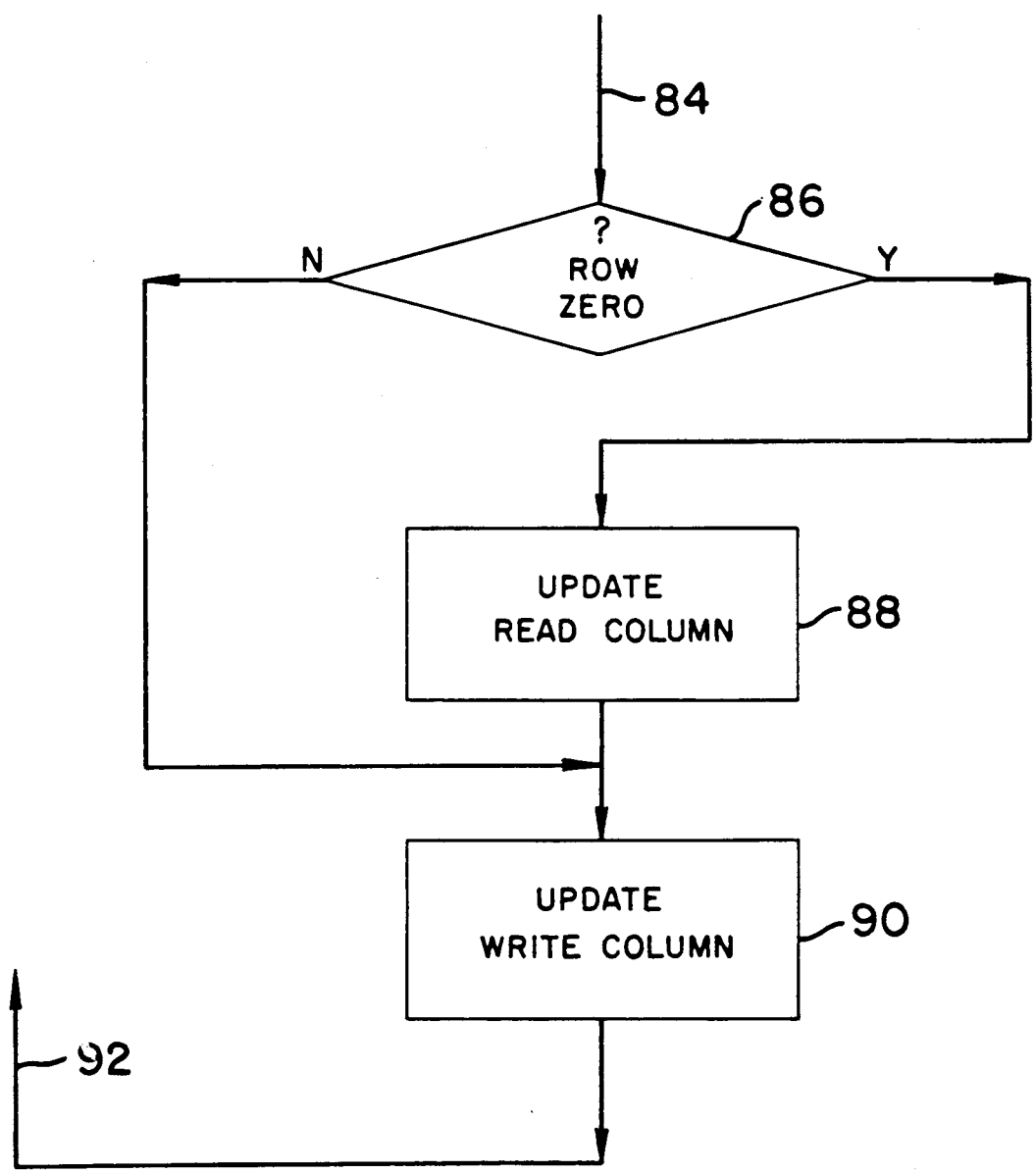

The operation of the system of FIGS. 2-4 will be seen from the flowcharts of FIGS. 5A and 5B. In step 72—INITIALIZE —, outset parameters are set to zero, these being the READ row, the READ column and the WRITE row. The outset value of the write column is not of consequence.

In step 74—? ROW ZERO—, inquiry is made as to whether row count is zero and is effected in detector 66 of FIG. 4. If the inquiry is answered in the affirmative, flow is to step 76—OUTPUT IDB—, wherein multiplexer 70 outputs the incoming data bit. In the event of negative reply to the inquiry of step 74, flow is to step 78—OUTPUT RAM—, wherein multiplexer 70 outputs the data bit then provided by RAM 44 on line 52 at the address specified by the current READ row, and current READ column modulo the number of j−1 elements in the current READ row.

In either reply instance, flow from steps 76 and 78 is to step 80—WRITE IDB IN RAM—, whereby the incoming bit are stored in random access memory, irrespective of whether it had been directly transmitted or not. The RAM address is specified by the current WRITE row, and current WRITE column modulo the number of j−1 elements in the current READ row.

To put matters in outset perspective, the initial data bit to be transmitted is directly transmitted, since row count is zero by virtue of initialization in step 72. Accordingly, in step 82—UPDATE READ AND WRITE ROWS—, row count is advanced to count one and the READ row is thus set at one. WRITE row is always equal to the READ row value then pending in the FIG. 2 system. In general, READ row is incremented by one and its value is updated modulo the l number of paths.

Line 84 indicates the flow connection as between FIGS. 5A and 5B. Stepping aside from the immediate discussion of outset activity, flow from step 82 is to step 86—? ROW ZERO —. Positive reply to the step 86 inquiry directs flow to step 88, wherein the READ column value is updated by one. In the event of either of positive or negative reply to the step 86 inquiry, flow is to step 90—UPDATE WRITE COLUMN—. This step is realized in FIG. 3 circuitry, wherein the preselected value of j is multiplied by the then existing READ row count value and such product is added to the value of the READ column count.

Following the updating of the WRITE column value, flow returns to step 74 through line 92.

An example is now set forth of practice in accordance with the invention thus far described for an interleaver with the parameters I=5, j=3 and j=15. The tabulation is, from left to right, of the IDB, the READ address by row and column, the WRITE address by row and column and the ODB. Downwardly, the tabulation considers successive IDBs from a zero or first bit through to input data bit one hundred-four.

| IDB | READ ADDRESS row | READ ADDRESS column | WRITE ADDRESS row | WRITE ADDRESS column | ODB |
|---|---|---|---|---|---|
| 0 | 0 | x | 0 | x | 0 |
| 1 | 1 | 0 | 1 | 3 | * |
| 2 | 2 | 0 | 2 | 6 | * |
| 3 | 3 | 0 | 3 | 9 | * |
| 4 | 4 | 0 | 4 | 12 | * |
| 5 | 0 | x | 0 | x | 5 |
| 6 | 1 | 1 | 1 | 0 | * |
| 7 | 2 | 1 | 2 | 7 | * |
| 8 | 3 | 1 | 3 | 10 | * |
| 9 | 4 | 1 | 4 | 13 | * |
| 10 | 0 | x | 0 | x | 10 |
| 11 | 1 | 2 | 1 | 1 | * |
| 12 | 2 | 2 | 2 | 0 | * |
| 13 | 3 | 2 | 3 | 11 | * |
| 14 | 4 | 2 | 4 | 14 | * |
| 15 | 0 | x | 0 | x | 15 |
| 16 | 1 | 3 | 1 | 2 | 1 |
| 17 | 2 | 3 | 2 | 1 | * |
| 18 | 3 | 3 | 3 | 0 | * |
| 19 | 4 | 3 | 4 | 15 | * |
| 20 | 0 | x | 0 | x | 20 |
| 21 | 1 | 0 | 1 | 3 | 6 |
| 22 | 2 | 4 | 2 | 2 | * |
| 23 | 3 | 4 | 3 | 1 | * |
| 24 | 4 | 4 | 4 | 0 | * |
| 25 | 0 | x | 0 | x | 25 |
| 26 | 1 | 1 | 1 | 0 | 11 |
| 27 | 2 | 5 | 2 | 3 | * |
| 28 | 3 | 5 | 3 | 2 | * |
| 29 | 4 | 5 | 4 | 1 | * |
| 30 | 0 | x | 0 | x | 30 |
| 31 | 1 | 2 | 1 | 1 | 16 |
| 32 | 2 | 6 | 2 | 4 | 2 |
| 33 | 3 | 6 | 3 | 3 | * |
| 34 | 4 | 6 | 4 | 2 | * |
| 35 | 0 | x | 0 | x | 35 |
| 36 | 1 | 3 | 1 | 2 | 21 |
| 37 | 2 | 7 | 2 | 5 | 7 |
| 38 | 3 | 7 | 3 | 4 | * |
| 39 | 4 | 7 | 4 | 3 | * |
| 40 | 0 | x | 0 | x | 40 |
| 41 | 1 | 0 | 1 | 3 | 26 |
| 42 | 2 | 0 | 2 | 6 | 12 |
| 43 | 3 | 8 | 3 | 5 | * |
| 44 | 4 | 8 | 4 | 4 | * |
| 45 | 0 | x | 0 | x | 45 |
| 46 | 1 | 1 | 1 | 0 | 31 |
| 47 | 2 | 1 | 2 | 7 | 17 |
| 48 | 3 | 9 | 3 | 6 | 3 |
| 49 | 4 | 9 | 4 | 5 | * |
| 50 | 0 | x | 0 | x | 50 |
| 51 | 1 | 2 | 1 | 1 | 36 |
| 52 | 2 | 2 | 2 | 0 | 22 |
| 53 | 3 | 10 | 3 | 7 | 8 |
| 54 | 4 | 10 | 4 | 6 | * |
| 55 | 0 | x | 0 | x | 55 |
| 56 | 1 | 3 | 1 | 2 | 41 |
| 57 | 2 | 3 | 2 | 1 | 27 |
| 58 | 3 | 11 | 3 | 8 | 13 |
| 59 | 4 | 11 | 4 | 7 | * |
| 60 | 0 | x | 0 | x | 60 |
| 61 | 1 | 0 | 1 | 3 | 46 |
| 62 | 2 | 4 | 2 | 2 | 32 |
| 63 | 3 | 0 | 3 | 9 | 18 |
| 64 | 4 | 12 | 4 | 8 | 4 |
| 65 | 0 | x | 0 | x | 65 |
| 66 | 1 | 1 | 1 | 0 | 51 |
| 67 | 2 | 5 | 2 | 3 | 37 |
| 68 | 3 | 1 | 3 | 10 | 23 |
| 69 | 4 | 13 | 4 | 9 | 9 |
| 70 | 0 | x | 0 | x | 70 |
| 71 | 1 | 2 | 1 | 1 | 56 |
| 72 | 2 | 6 | 2 | 4 | 42 |
| 73 | 3 | 2 | 3 | 11 | 28 |
| 74 | 4 | 14 | 4 | 10 | 14 |
| 75 | 0 | x | 0 | x | 75 |
| 76 | 1 | 3 | 1 | 2 | 61 |
| 77 | 2 | 7 | 2 | 5 | 47 |
| 78 | 3 | 3 | 3 | 0 | 33 |
| 79 | 4 | 15 | 4 | 11 | 19 |
| 80 | 0 | x | 0 | x | 80 |
| 81 | 1 | 0 | 1 | 3 | 66 |
| 82 | 2 | 0 | 2 | 6 | 52 |
| 83 | 3 | 4 | 3 | 1 | 38 |
| 84 | 4 | 0 | 4 | 12 | 24 |
| 85 | 0 | x | 0 | x | 85 |
| 86 | 1 | 1 | 1 | 0 | 71 |
| 87 | 2 | 1 | 2 | 7 | 57 |
| 88 | 3 | 5 | 3 | 2 | 43 |
| 89 | 4 | 1 | 4 | 13 | 29 |
| 90 | 0 | x | 0 | x | 90 |
| 91 | 1 | 2 | 1 | 1 | 76 |
| 92 | 2 | 2 | 2 | 0 | 62 |
| 93 | 3 | 6 | 3 | 3 | 48 |
| 94 | 4 | 2 | 4 | 14 | 34 |
| 95 | 0 | x | 0 | x | 95 |
| 96 | 1 | 3 | 1 | 2 | 81 |
| 97 | 2 | 3 | 2 | 1 | 67 |
| 98 | 3 | 7 | 3 | 4 | 53 |
| 99 | 4 | 3 | 4 | 15 | 39 |
| 100 | 0 | x | 0 | x | 100 |
| 101 | 1 | 0 | 1 | 3 | 86 |
| 102 | 2 | 4 | 2 | 2 | 72 |
| 103 | 3 | 8 | 3 | 5 | 58 |
| 104 | 4 | 4 | 4 | 0 | 44 | x = not of consequence
* = old data

The values listed in the tabulation were generated according to the procedure described in FIGS. 5a and 5b, which is now further explained for processing IDB0 through IDB2.

| STEP | IDB | READ ADDRESS row | READ ADDRESS column | WRITE ADDRESS row | WRITE ADDRESS column | ODB |
|---|---|---|---|---|---|---|
| 72 | 0 | 0 | 0 | 0 | x | |

Initialize READ row, READ column, and WRITE row to zero (note: the READ column address is not used when READ row is equal to zero, and the WRITE column address is arbitrary when READ row is equal to zero).

| 74 | 0 | 0 | 0 | 0 | x | |

The first IDB (zero) is processed. READ row is tested for the value zero.

| 76 | 0 | 0 | 0 | 0 | x | 0 |

READ row value is equal to zero, and IDB0 is output as ODB.

| 80 | 0 | 0 | 0 | 0 | x | |

This WRITE IDB was of no consequence because whenever the READ row is equal to zero the corresponding IDB is never read from the RAM.

| 82 | 0 | 1 | 0 | 1 | x | |

READ row is incremented by one and processed modulo In. WRITE row is set equal to READ row.

| 86 | 0 | 1 | 0 | 1 | x | |

READ row is tested for the value zero.

-continued

| STEP | IDB | READ ADDRESS row | READ ADDRESS column | WRITE ADDRESS row | WRITE ADDRESS column | ODB |
|---|---|---|---|---|---|---|
| 90 | 0 | 1 | 0 | 1 | 3 | |
| | WRITE column is updated by multiplying READ row by the number of elements j, and this product is added to the READ column value. | | | | | |
| 74 | 1 | 1 | 0 | 1 | 3 | |
| | The next IDB is processed. READ row is tested for zero. | | | | | |
| 78 | 1 | 1 | 0 | 1 | 3 | |
| | READ row is not equal to zero, and OUTPUT RAM is processed from the address given by READ row, READ column. Since this location had not previously been written into, the contents are unknown. | | | | | |
| 80 | 1 | 1 | 0 | 1 | 3 | |
| | The IDB is written into RAM at the address given by WRITE row, WRITE column. | | | | | |
| 82 | 1 | 2 | 0 | 2 | 3 | |
| | READ row is incremented by one and processed modulo In. WRITE row is set equal to the READ row. | | | | | |
| 86 | 1 | 2 | 0 | 2 | 3 | |
| | READ row is tested for the value zero. | | | | | |
| 90 | 1 | 2 | 0 | 2 | 6 | |
| | WRITE column is updated by multiplying READ row by the number of elements j, and this product is added to the READ column value. | | | | | |

These steps were repeated for all of the IDBs listed, and in addition, for every instance where the READ row value was equal to zero at step 86, step 88 was executed to increment the value of READ column by one, and processing continued with step 90.

Figure 1:
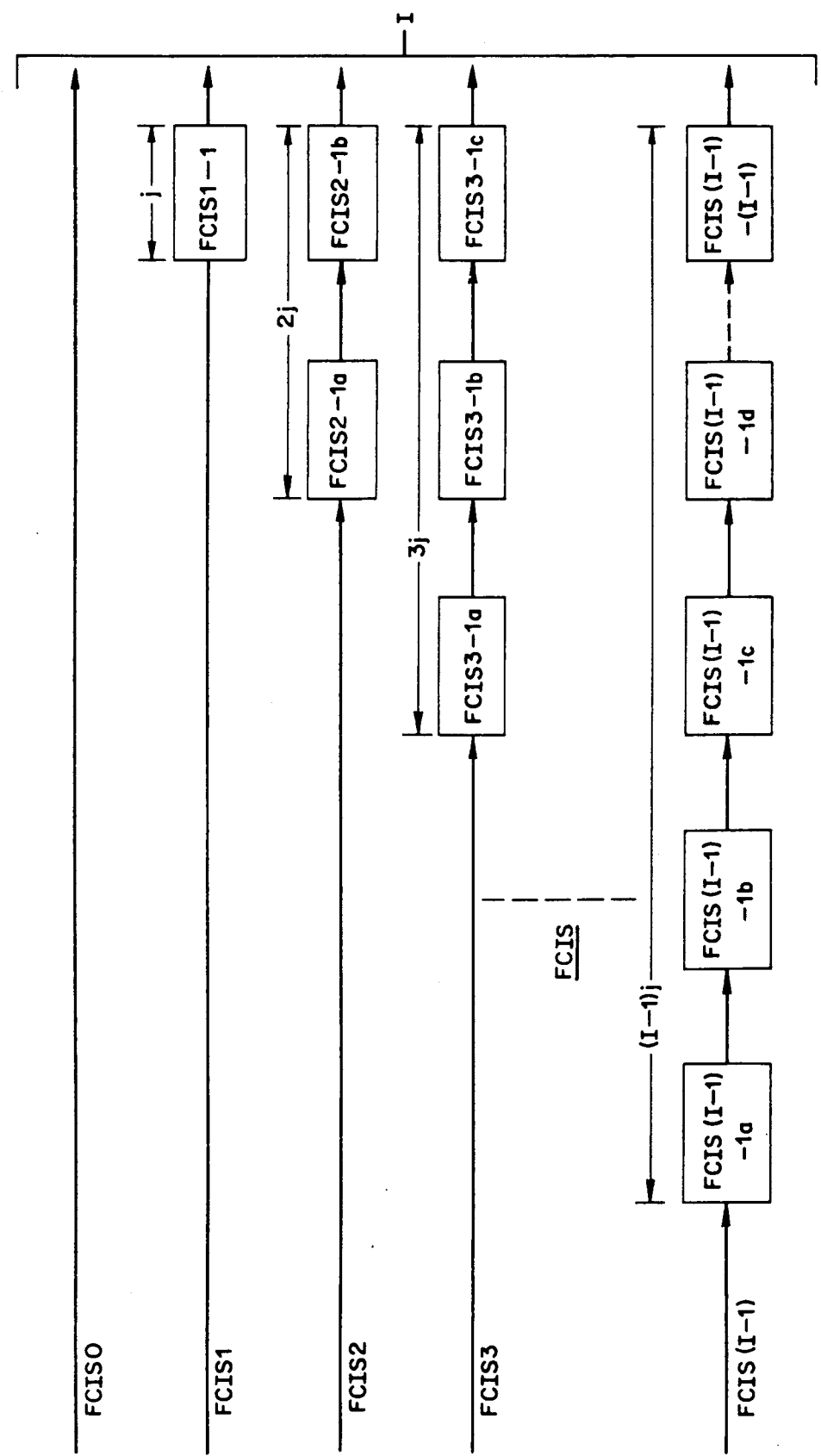
FIG. 1 depicts the above discussed shift register element implementation of interleaver as known in the prior art.
Figure 6:
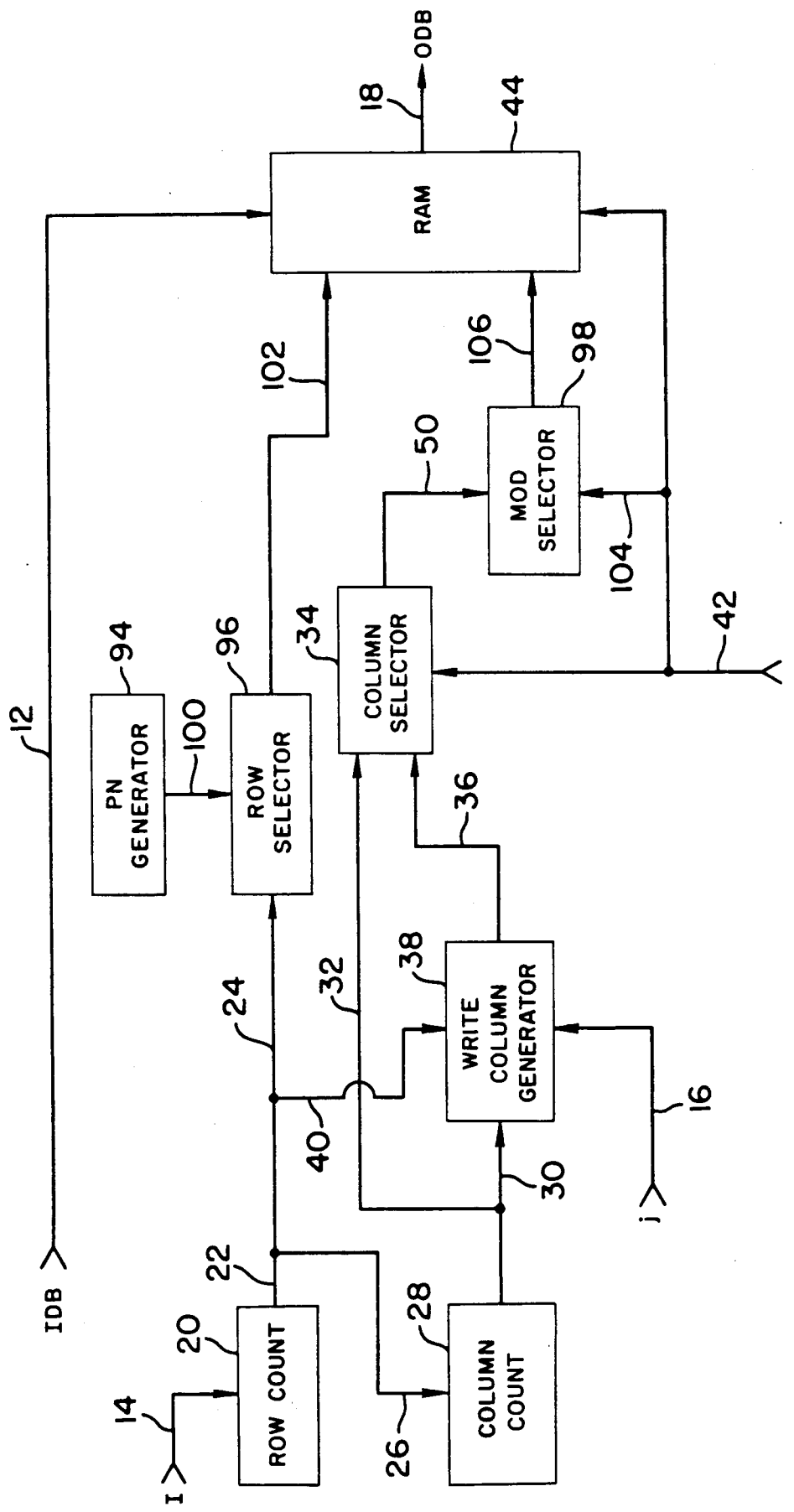
FIG. 6 is a functional block diagram of further system in accordance with the invention.

A second embodiment of an interleaver in accordance with the invention is shown in FIG. 6 and is of pseudo random convolutional interleaving type. Reference numerals of FIG. 1 are carried over to the FIG. 6 system where the FIG. 1 component is employed. There are several differences between the two systems as now noted.

The FIG. 6 system does not employ ODB selector 54 of FIG. 1, for reasons discussed below. The FIG. 6 system introduces three further components, namely, PN generator 94, which generates pseudo random number sets, row selector 96, and MOD selector 96, which performs a modulo (I) function on column addresses. Line 100 applies the output of generator 94 to row selector 96, line 102 applies the output of selector 96 to RAM 44, line 104 advises the MOD selector of READ/WRITE status, and line 106 applies the output of selector 98 to RAM 44. The system output line 18 is directly supplied by RAM 44.

In not employing ODB selector 54, the FIG. 6 system (the PN system) introduces a single cell delay in the FCIS0 (FIG. 1) path. Each consecutive In path introduces n[j] delay cells. The initial path cell is introduced so that the transmit symbol corresponding to that row can be randomized. In the PN mode, PN sequences are applied to consecutive groups of In transmit symbols to row selector 96 and each PN sequence is of length In. Each sequence entry (PNi) points to a row address (I) for storing the transmit symbol.

The algorithm for PN mode maps the standard convolutional interleaver into a matrix of (I) delay rows by $(I-1)*[j]$ delay columns, and will be discussed in connection with FIGS. 7A and 7B below.

The matrix interleaver memory element storage requirements for PN mode involve a number of RAM cells equal to $((I-1)*(j+2)*I/2) +1$. These requirements are slightly greater than a shift register implementation because of the $(j+2)$ term, but substantially less than past RAM based implementation, which now has an additional I term required to perform the PN function, as follows: $I*j*I +I$. Further, a shift register implementation requires an additional processing element to randomize the symbols before they are input to the shift registers and requires substantially more discrete components.

Figure 7A:
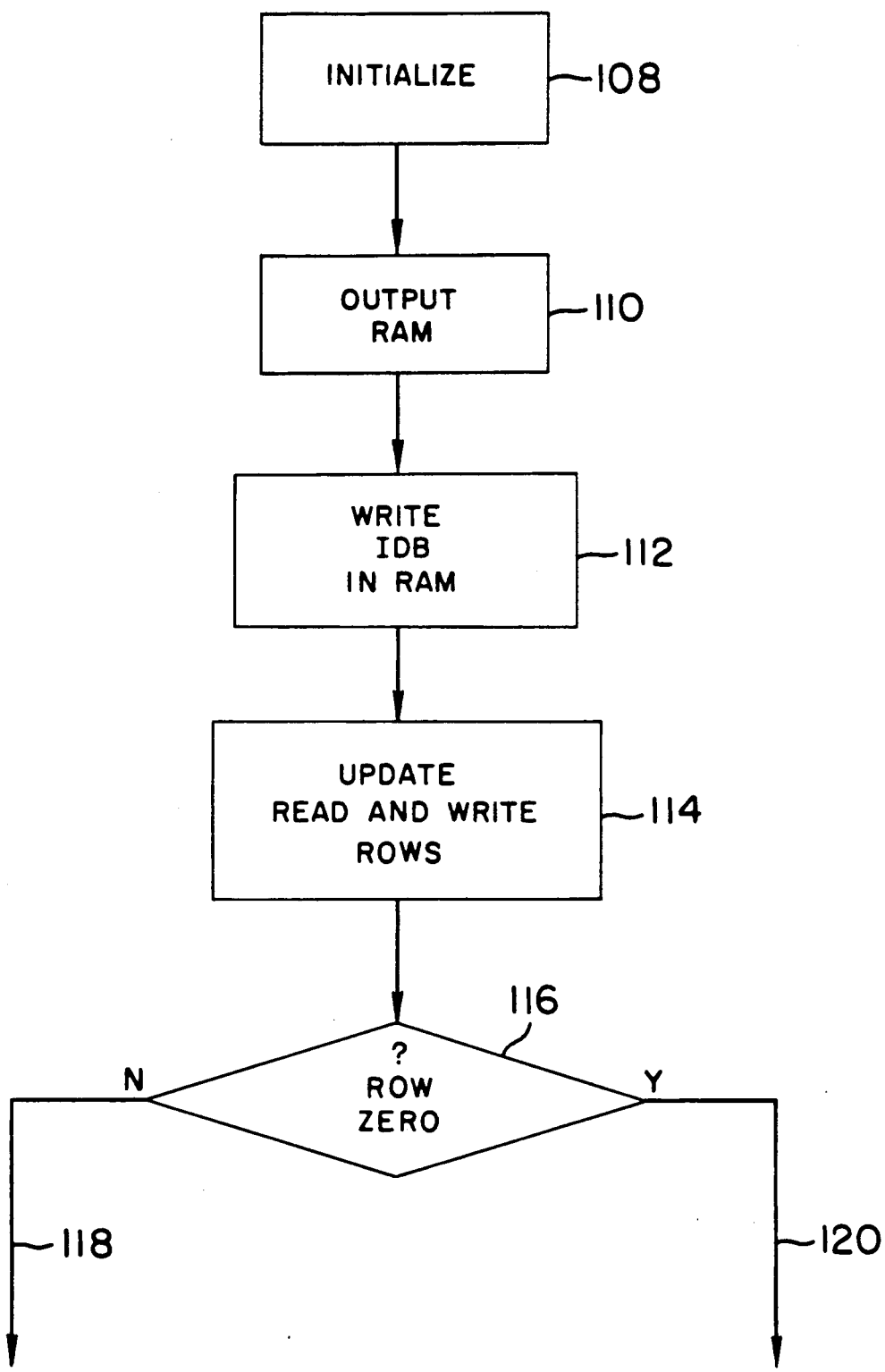
FIGS. 7A and 7B set forth flow charts of system activity in the FIG. 6 system.
Figure 7B:
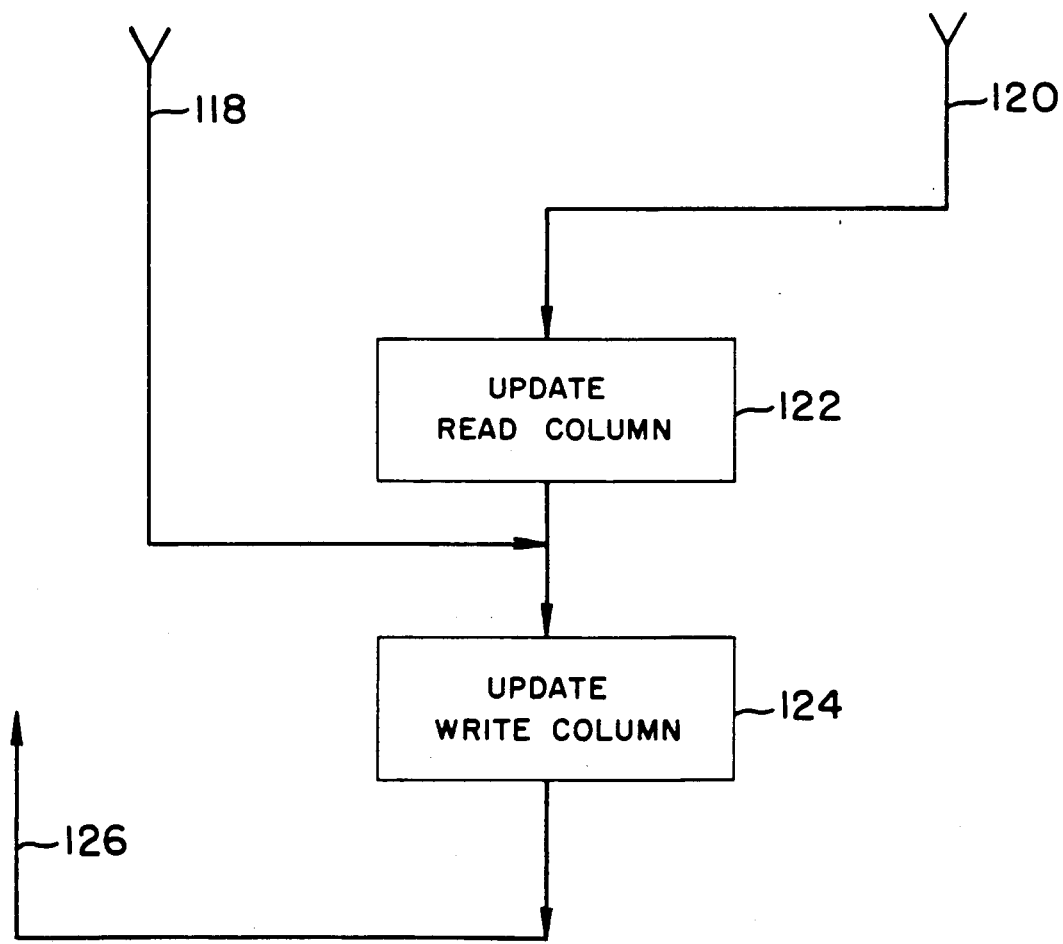

The operation of the system of FIG. 6 is seen from the flowcharts of FIGS. 7A and 7B. In step 108—INITIALIZE—, outset parameters are set to initial values. The READ row is zero. The READ column is set to $(I-1)*j-1$. The WRITE row is set to PNi, which is the first element of the pseudo random sequence. The WRITE column is set to $(Pni*j)+RDcol+1$.

Flow is to step 110—OUTPUT RAM—, wherein RAM 44 outputs a data bit from the address given by READ row and READ column modulo the number of elements in the current READ row. Flow is then to step 112, —WRITE IDB IN RAM—, whereby the incoming data bits is stored in random access memory at the address given by WRITE row, and WRITE column modulo the number of elements in the WRITE row.

In step 114, —UPDATE READ AND WRITE ROWS—, the READ row is set to ([RD row +1] Modulo I) and the write row is set to Pni, the next pseudo random element. Flow is then to step 116, —? ROW ZERO—, wherein inquiry is made as to whether the READ row as set in step 114 is zero.

Lines 118 and 120 join FIGS. 7A and 7B, respectively indicating negative and positive responses to the step 116 inquiry. Assuming a positive response, flow is to step 122, —UPDATE READ COLUMN—. Here, the READ column value is incremented by one. In the case of either a positive or negative response to the step 116 inquiry, flow is ultimately to step 124, —UPDATE WRITE COLUMN—, wherein the WRITE column is set to $(PNi*j)+RDcol+1$. Line 126 now returns the practice to step 110 for the next cycle.

An example of PN mode operation is now set forth, with the tabulation following that above for the non-PN example given for the system of FIGS. 2-4, for a PN interleaver with parameters I=5, j=3 and J=15. Prior to listing the tabulation, the PN sequence used in now set forth:

| | PN SEQUENCE |
|---|---|
| | 0 1 2 3 4 |
| PN0 | 0-2-4-1-3 |
| PN1 | 2-4-1-3-0 |
| PN2 | 4-1-3-0-2 |
| PN3 | 1-3-0-2-4 |
| PN4 | 3-0-2-4-1 |
| PN5 | 0-1-2-3-4 |
| PN6 | 4-3-2-1-0 |
| PN7 | 1-3-4-2-0 |
| PN8 | 2-1-4-3-0 |
| PN9 | 1-4-2-0-3 |
| PN10 | 0-4-2-1-3 |
| PN11 | 3-2-4-1-0 |
| PN12 | 4-2-3-0-1 |
| PN13 | 2-3-1-0-4 |
| PN14 | 1-0-4-3-2 |
| PN15 | 3-1-2-0-4 |

| IDB | READ ADDRESS row | READ ADDRESS column | WRITE ADDRESS row | WRITE ADDRESS column | ODB |
|---|---|---|---|---|---|
| 0 | 0 | 0 | 0 | 0 | * |
| 1 | 1 | 4 | 2 | 6 | * |
| 2 | 2 | 9 | 4 | 12 | * |
| 3 | 3 | 14 | 1 | 3 | * |
| 4 | 4 | 19 | 3 | 9 | * |
| 5 | 0 | 0 | 2 | 7 | 0 |
| 6 | 1 | 0 | 4 | 13 | * |
| 7 | 2 | 0 | 1 | 4 | * |
| 8 | 3 | 0 | 3 | 10 | * |
| 9 | 4 | 0 | 0 | 0 | 0 |
| 10 | 0 | 0 | 4 | 14 | 9 |
| 11 | 1 | 1 | 1 | 0 | * |
| 12 | 2 | 1 | 3 | 11 | * |
| 13 | 3 | 1 | 0 | 0 | * |
| 14 | 4 | 1 | 2 | 8 | * |
| 15 | 0 | 0 | 1 | 1 | 13 |
| 16 | 1 | 2 | 3 | 12 | * |
| 17 | 2 | 2 | 0 | 0 | * |
| 18 | 3 | 2 | 2 | 9 | * |
| 19 | 4 | 2 | 4 | 15 | * |
| 20 | 0 | 0 | 3 | 13 | 17 |
| 21 | 1 | 3 | 0 | 0 | 3 |
| 22 | 2 | 3 | 2 | 0 | * |
| 23 | 3 | 3 | 4 | 16 | 8 |
| 24 | 4 | 3 | 1 | 2 | * |
| 25 | 0 | 0 | 0 | 0 | 21 |
| 26 | 1 | 4 | 1 | 3 | 7 |
| 27 | 2 | 4 | 2 | 1 | * |
| 28 | 3 | 4 | 3 | 14 | * |
| 29 | 4 | 4 | 4 | 17 | * |
| 30 | 0 | 0 | 4 | 18 | 25 |
| 31 | 1 | 0 | 3 | 0 | 11 |
| 32 | 2 | 5 | 2 | 2 | * |
| 33 | 3 | 5 | 1 | 4 | * |
| 34 | 4 | 5 | 0 | 0 | * |
| 35 | 0 | 0 | 1 | 0 | 34 |
| 36 | 1 | 1 | 3 | 1 | 15 |
| 37 | 2 | 6 | 4 | 19 | 1 |
| 38 | 3 | 6 | 2 | 3 | * |
| 39 | 4 | 6 | 0 | 0 | * |
| 40 | 0 | 0 | 2 | 4 | 39 |
| 41 | 1 | 2 | 1 | 1 | 24 |
| 42 | 2 | 7 | 4 | 0 | 5 |
| 43 | 3 | 7 | 3 | 2 | * |
| 44 | 4 | 7 | 0 | 0 | * |
| 45 | 0 | 0 | 1 | 2 | 44 |
| 46 | 1 | 3 | 4 | 1 | 26 |
| 47 | 2 | 8 | 2 | 5 | 14 |
| 48 | 3 | 8 | 0 | 0 | * |
| 49 | 4 | 8 | 3 | 3 | * |
| 50 | 0 | 0 | 0 | 0 | 48 |
| 51 | 1 | 4 | 4 | 2 | 33 |
| 52 | 2 | 9 | 2 | 6 | 18 |
| 53 | 3 | 9 | 1 | 3 | 4 |
| 54 | 4 | 9 | 3 | 4 | * |
| 55 | 0 | 0 | 3 | 5 | 50 |
| 56 | 1 | 0 | 2 | 7 | 35 |
| 57 | 2 | 0 | 4 | 3 | 22 |
| 58 | 3 | 10 | 1 | 4 | 8 |
| 59 | 4 | 10 | 0 | 0 | * |
| 60 | 0 | 0 | 4 | 4 | 59 |
| 61 | 1 | 1 | 2 | 8 | 41 |
| 62 | 2 | 1 | 3 | 6 | 27 |
| 63 | 3 | 11 | 0 | 0 | 12 |
| 64 | 4 | 11 | 1 | 0 | * |
| 65 | 0 | 0 | 2 | 9 | 63 |
| 66 | 1 | 2 | 3 | 7 | 45 |
| 67 | 2 | 2 | 1 | 1 | 32 |
| 68 | 3 | 12 | 0 | 0 | 16 |
| 69 | 4 | 12 | 4 | 5 | 2 |
| 70 | 0 | 0 | 1 | 2 | 68 |
| 71 | 1 | 3 | 0 | 0 | 53 |
| 72 | 2 | 3 | 4 | 6 | 38 |
| 73 | 3 | 13 | 3 | 8 | 20 |
| 74 | 4 | 13 | 2 | 0 | 6 |
| 75 | 0 | 0 | 3 | 9 | 71 |
| 76 | 1 | 4 | 1 | 3 | 58 |
| 77 | 2 | 4 | 2 | 1 | 40 |
| 78 | 3 | 14 | 0 | 0 | 28 |
| 79 | 4 | 14 | 4 | 7 | 10 |

* = old data

By way of summary of the foregoing and as a prelude to the claims below, the two system embodiments are now characterized.

The system of FIGS. 2-4 receives digital data signals for convolutional interleaving thereof in accordance with preselected convolutional interleaving parameters, namely I and J.

The system includes a random access memory having a first input for receipt of the data signals, a second input for receiving row and column WRITE address signals for identifying storage locations in the memory for such received data signals, a third input for receiving row and column READ address signals for identifying storage locations from which data signals are to be read out of said memory, and an output terminal for conveying such read out data signals from said memory.

Multiplexer 70 of ODB selector 54 constitutes a system output component for issuing such convolutionally interleaved data signals and has first and second input terminals respectively for the receipt of the IDB signals and the receipt of the signals conveyed from the memory, an output terminal for furnishing the convolutionally interleaved data signals, and a third input terminal for receipt of a control signal for selectively connecting the first or said second input terminal with the output terminal. In the particular version of the system illustrated in FIGS. 2-4, the control signal is the row zero signal.

The circuitry of the system of FIGS. 2-4 identified by the reference numerals 20 through 38 may be broadly viewed as a control unit for receiving input signals indicative of the convolutional interleaving parameters for selective generation of row and column WRITE and READ address signals for storage and read out of the data signals and for generation of the control signal.

In other aspects, the system of FIGS. 2-4 provides in the control unit a row counter responsive to one of the convolutional interleaving parameter (I) signals and a row count zero detecting means responsive to row count for generating the control signal. The row counter is resettable at count I and the control unit also includes a column counter incremented by the row count resetting. The control unit further includes a WRITE column generator responsive to the row count, the column count and a second one (j) of the convolutional interleaving parameter signals for generating the column WRITE address signals.

The system of FIG. 6 is adapted for receiving digital data signals and for pseudo random convolutional interleaving thereof in accordance with preselected convolutional interleaving parameters. This embodiment includes the memory unit as above summarized, but does not employ the output selection of the first system, as above discussed. Further, the control unit of the FIG. 6 system has characteristics not present in the first system, namely, a pseudo random number generator, operative in the generation of row WRITE and READ address signals, a row selector, and a modulo selector, performing a modulo function at the value of one of the convolutional interleaving parameter (I) signals and operative in the generation of column WRITE and READ address signals.

As in the FIGS. 2–4 system, the FIG. 6 system includes a WRITE column generator, responsive to the other convolutional interleaving parameter (j) signal in the course of column address provision.

The pseudo random number generator generates sequences of random number signals corresponding in number to the I convolutional interleaving parameter signal.

Various changes may be introduced in the foregoing practices of the invention and in the system embodiments without departing from the invention. Accordingly, the particularly described preferred methods and apparatus are intended in an illustrative and not in a limiting sense. The true spirit and scope of the invention is set forth in the appended claims.

What is claimed is:

1. A system for receiving digital data signals and for convolutional interleaving thereof in accordance with preselected convolutional interleaving parameters to provide convolutionally interleaved output signals, said system comprising:
   (a) a random access memory having first input means for receipt of said data signals, second input means for receiving row and column WRITE address signals for identifying storage locations in said memory for such received data signals, third input means for receiving row and column READ address signals for identifying storage locations from which data signals are to be read out of said memory, and means for conveying such read out data signals from said memory;
   (b) output means having first and second input terminals respectively for receipt of said digital data signals and receipt of said read out signals conveyed by the conveying means, an output terminal, and a third input terminal for receipt of a control signal for selectively connecting said first or said second input terminal with said output terminal; and
   (c) control means for receiving input signal indicative of said convolutional interleaving parameters for selective generation of row and column WRITE and READ address signals for storage and read out of said data signals and for generation for said control signal, signals provided by said output terminal of said output means constituting said convolutionally interleaved output signals.

2. The invention claimed in claim 1 wherein said control means includes row count means responsive to one of said convolutional interleaving parameter signals and row count zero detecting means responsive to said row count means for generating said control signal.

3. The invention claimed in claim 2 wherein said row count means is resettable on attaining a count corresponding to said one convolutional parameter signal.

4. The invention claimed in claim 3 wherein said control means further includes column count means incremented upon each resetting of said row count means.

5. The invention claimed in claim 4 wherein said control means further includes WRITE column generator means responsive to said row count, said column count and a second one of said convolutional interleaving parameter signals for generating said column WRITE address signals.

6. The invention claimed in claim 5 wherein said WRITE column generator means comprises multiplier means for receiving said row count and said second one of said convolutional interleaving parameter signals and generating an output signal indicative of the product of multiplication thereof.

7. The invention claimed in claim 6 wherein said WRITE column generator means further includes summation means for receiving said column count and said multiplier means output signal and generating an output signal indicative of such summation.

8. A system for receiving digital data signals and for pseudo random convolutional interleaving thereof in accordance with preselected convolutional interleaving parameters to provide convolutionally interleaved output signals, said system comprising:
   (a) a random access memory having first input means for receipt of said data signals, second input means for receiving row and column WRITE address signals for identifying storage locations in said memory for such received data signals, third input means for receiving row and column READ address signals for identifying storage locations from which data signals are to be read out of said memory, and means for conveying such read out data signals from said memory; and
   (b) control means for receiving input signals indicative of said convolutional interleaving parameters for selective generation of row and column WRITE and READ address signals for storage and read out of said data signals, said control means including pseudo random number generating means operative in the generation of row WRITE and READ address signals and modulo means performing a modulo function at a value of one of such convolutional interleaving parameter signals and operative in the generation of column WRITE and READ address signals, read out signals provided by the conveying means constituting said convolutionally interleaved output signals.

9. The invention claimed in claim 8 wherein said pseudo random number generating means generates sequences of random number signals corresponding in number to said one convolutional interleaving parameter signal.

10. The invention claimed in claim 9 wherein said control means further includes row count means and wherein said row count means is resettable on attaining a count corresponding to said one convolutional interleaving parameter.

11. The invention claimed in claim 10 wherein said control means further includes column count means incremented upon each resetting of said row count means.

12. The invention claimed in claim 11 wherein said control means further includes WRITE column generator means responsive to said row count, said column count and a second one of said convolutional interleaving parameter signals for generating an output signal.

13. The invention claimed in claim 12 wherein said WRITE column generator means comprises multiplier means for receiving said row count and said second one of said convolutional interleaving parameter signals and generating an output signal indicative of the product of multiplication thereof.

14. The invention claimed in claim 13 wherein said WRITE column generator means further includes summation means for receiving said column count and said multiplier means output signal and generating said output signal to be indicative of such summation.

15. The invention claimed in claim 14 wherein said control means further includes column selector means receiving said column count and said output signal of said WRITE column generator means and selectively providing one thereof as its output signal.

16. The invention claimed in claim 15 wherein said modulo means of said control means receives said column selector means output signal as an input and performs said modulo function on such input in generating said WRITE column address signals.

* * * * *

UNITED STATES PATENT AND TRADEMARK OFFICE
CERTIFICATE OF CORRECTION

PATENT NO. : 5,042,033
DATED : August 20, 1991
INVENTOR(S) : Tony M. Costa It is certified that error appears in the above-identified patent and that said Letters Patent is hereby corrected as shown below:

```
Drawings - Fig. 5A.   Change "Unitialize" to -- Initialize --
Col. 1, line 33.  Change "𝓧" to -- "I" --
Col. 2, line 32.  Change "ar" to -- are --
Col. 3, line 19.  Change "identity" to -- identify --
Col. 3, line 26.  After "is" insert -- a --
Col. 3, line 28.  After "is" insert -- a --
Col. 3, line 34.  After "of" insert -- a --
Col. 4, line 4.   Change "to" to -- row --
Col. 4, line 44.  Change "are" to -- is --
Col. 8, line 23.  Change "is" to -- are --
Col. 8, line 48.  Change "in" to -- is --
Col. 8, line 52.  Change "PN SEQUENCE" to -- PN SEQUENCE I --
Col. 9, line 13.  "9 4 0 0 0" should be -- 9 4 0 0 * --
```

Signed and Sealed this

Thirteenth Day of April, 1993

*Attest:*

STEPHEN G. KUNIN

*Attesting Officer*     *Acting Commissioner of Patents and Trademarks*